US010658328B2

(12) United States Patent
Lee et al.

(10) Patent No.: US 10,658,328 B2
(45) Date of Patent: May 19, 2020

(54) DETECTION OF FOREIGN PARTICLES DURING WIRE BONDING

(71) Applicant: ASM Technology Singapore Pte Ltd, Singapore (SG)

(72) Inventors: Tact Lee, Hong Kong (HK); Chin Kei Lai, Hong Kong (HK); Chung Yan Lau, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 145 days.

(21) Appl. No.: 15/807,899

(22) Filed: Nov. 9, 2017

(65) Prior Publication Data

US 2019/0139929 A1   May 9, 2019

(51) Int. Cl.
*H01L 23/00* (2006.01)
*G06T 7/00* (2017.01)

(52) U.S. Cl.
CPC ............ *H01L 24/78* (2013.01); *G06T 7/0004* (2013.01); *H01L 24/85* (2013.01); *G06T 2207/30148* (2013.01); *H01L 24/05* (2013.01); *H01L 24/06* (2013.01); *H01L 24/45* (2013.01); *H01L 24/48* (2013.01); *H01L 24/49* (2013.01); *H01L 2224/05553* (2013.01); *H01L 2224/0603* (2013.01); *H01L 2224/45124* (2013.01); *H01L 2224/48247* (2013.01); *H01L 2224/48472* (2013.01); *H01L 2224/4903* (2013.01); *H01L 2224/49113* (2013.01); *H01L 2224/78353* (2013.01); *H01L 2224/78901* (2013.01); *H01L 2224/859* (2013.01); *H01L 2224/85205* (2013.01); *H01L 2924/00014* (2013.01); *H01L 2924/3701* (2013.01)

(58) Field of Classification Search
None
See application file for complete search history.

(56) References Cited

U.S. PATENT DOCUMENTS

| 4,984,730 A * | 1/1991 | Gobel | B23K 20/004 228/1.1 |
| 2002/0028524 A1* | 3/2002 | Koduri | H01L 24/85 438/14 |
| 2003/0098426 A1* | 5/2003 | Hayata | B23K 20/004 250/559.34 |

(Continued)

Primary Examiner — Andrae S Allison
(74) Attorney, Agent, or Firm — Ostrolenk Faber LLP

(57) ABSTRACT

A method of bonding wires onto surfaces, an apparatus and a computer program product are disclosed. The method of bonding wires onto surfaces, comprises the steps of: collecting operating characteristics of a bonding tool while forming a wire bond which bonds a wire to a surface; determining whether a possible bonding failure of the wire bond has occurred as indicated by the operating characteristics; and capturing an image of the wire bond to identify whether a foreign body is present on the surface if it is determined that a possible bonding failure has occurred. In this way, imaging of the wire bond is only necessary when the operating characteristics indicate a suspect bonding failure has occurred. This avoids the need to image every bond, while still imaging suspect bonds. This approach helps to significantly increase the throughput of the wire bonding apparatus whilst still identifying and classifying bonding defects due to the presence of a foreign body.

20 Claims, 4 Drawing Sheets

(56) References Cited

U.S. PATENT DOCUMENTS

| | | | | |
|---|---|---|---|---|
| 2004/0200884 | A1* | 10/2004 | Adorni | B23K 20/004 |
| | | | | 228/180.5 |
| 2007/0095140 | A1 | 5/2007 | Kollgaard | G01N 29/0645 |
| | | | | 73/633 |
| 2007/0187138 | A1* | 8/2007 | Takahashi | H01L 24/78 |
| | | | | 174/257 |
| 2011/0045640 | A1* | 2/2011 | Or | H01L 24/29 |
| | | | | 438/119 |
| 2013/0119114 | A1* | 5/2013 | Zong | B23K 31/125 |
| | | | | 228/104 |
| 2014/0131425 | A1* | 5/2014 | Liu | H01L 24/78 |
| | | | | 228/104 |
| 2015/0162299 | A1* | 6/2015 | Keller | H01L 22/26 |
| | | | | 228/102 |
| 2016/0296982 | A1* | 10/2016 | Hirakawa | B08B 7/04 |
| 2017/0110437 | A1* | 4/2017 | Garing | H01L 21/02068 |
| 2018/0090464 | A1* | 3/2018 | Hayata | B23K 20/007 |

* cited by examiner

US 10,658,328 B2

DETECTION OF FOREIGN PARTICLES DURING WIRE BONDING

FIELD OF THE INVENTION

The present invention relates to a method of bonding wires onto surfaces, an apparatus and a computer program product.

BACKGROUND

Wire bonding is the process of making electrical connections in semiconductor components by means of fine metal wire, typically wire with a diameter of from 12 microns to 500 microns. Examples of electrical connections which can be made using wire bonding techniques include connections between the contact surfaces of discrete or integrated chips and the contact leads of their packages, and, in the case of hybrid circuits, the connections between inserted monolithic elements and the film circuit which contains them.

A number of wire bonding techniques have been developed, one which is a microwelding technique using ultrasound. Aluminium wire, in contact with the contact surface to which it is to be bonded, is moved vigorously in the direction of the surface to which it is to be bonded so that its oxide layer breaks open. The wire is then subjected to pressure, and a permanent junction is created between the two materials. Motion of the wire is generated by an ultrasonic transducer excited by an ultrasonic generator to produce high-frequency mechanical vibrations.

In a particular wire bonding process known as wedge bonding, the amount of ultrasonic energy that is supplied depends on a size of the wire used. The ultrasonic energy is directed to the aluminium wire by a special tool known as a "wedge". The wire is fed through a guide at the bottom of the wedge. When the wedge with the aluminium wire touches the surface to which the wire is to be bonded, movement is stopped. The wire is pressed down with a small defined force, known as the bonding weight and the wire is deformed. This deformation is known as "pre-deformation". Ultrasonic energy is now switched on and the welding process starts. During this time, the diameter of the aluminium wire is reduced, the actual reduction depending on the size, physical properties and the precise chemical nature of the wire.

It is important in an automatic wire bonding apparatus to have as much control as possible over the process and to be able to determine whether or not a bond has been successfully made. In particular, it is important to be able to ascertain whether a bond has been made successfully at the time of bonding rather than during a subsequent test routine. Because of the very rapid throughput of an automatic wire bonding apparatus, it would be advantageous if the bonding could be monitored immediately at the time of bonding, so that after the formation of an unsatisfactory bond the process can be stopped and the bonding conditions checked to prevent the production of a large number of unsatisfactory bonds, with the consequent wastage of time and expensive components and materials.

Although some existing wire bonding machines can perform certain tests for monitoring bonding failures, these can still be unsatisfactory. Accordingly, it is desired to provide an improved technique for detecting bonding failures.

SUMMARY

According to a first aspect of the invention, there is provided a method of bonding wires onto surfaces, comprising the steps of: collecting operating characteristics of a bonding tool while forming a wire bond which bonds a wire to a surface; determining whether a possible bonding failure of the wire bond has occurred as indicated by the operating characteristics; and capturing an image of the wire bond to identify whether a foreign particle is present on the surface if it is determined that a possible bonding failure has occurred.

The first aspect of the invention recognises that accurately detecting a problem with wire bonding can be problematic. In particular, existing techniques find it difficult to classify some types of wire bonding defects, such as those caused by the presence of foreign bodies which can cause electrical shorting between bond pads which typically results in functional failures of a component which are only detected during electrical testing after encapsulation. The first aspect also recognises that while inspecting a wire bond using imaging can reveal the presence of such foreign bodies, such imaging is time consuming and leads to a significant reduction in throughput of the wire bonding apparatus when performing such inspections. Accordingly, a method is provided. The method may be for bonding a wire to a surface. The method may comprise the step of collecting or measuring operating characteristics or properties. Those operating characteristics may be received from a bonding tool and may be collected or measured while the bonding tool forms a wire bond. The wire bond may bond a wire to a surface. The method may comprise determining or identifying whether a possible, likely, potential or suspected bonding failure of the wire bond has occurred. That suspect bonding failure may be indicated by the operating characteristics. The method may comprise capturing or receiving an image of the wire bond. The image may be captured or received when it was determined that a possible or suspected bonding failure has occurred. The image may identify whether a foreign particle is present on the surface to which the wire is bonded. In this way, imaging of the wire bond is only necessary when the operating characteristics indicate a suspect bonding failure has occurred. This avoids the need to image every bond, while still imaging suspect bonds. This approach helps to significantly increase the throughput of the wire bonding apparatus whilst still identifying and classifying bonding defects due to the presence of a foreign particle.

In one embodiment, the operating characteristics comprise at least one of energy consumed by the bonding tool and a deformation of the wire while forming the wire bond. Accordingly, the operating characteristics may be a measure of the energy provided or power consumed by the bonding tool during the formation of the wire bond. The operating characteristics may additionally or alternatively comprise a measure of the deformation or distortion of the wire during the formation of the wire bond.

In one embodiment, the operating characteristics comprise at least one of energy consumed by the bonding tool and a deformation of the wire over a bonding period while forming the wire bond. Accordingly, the operating characteristics may be a measure of the energy provided or the power consumed over time by the bonding tool during the formation of the wire bond. The operating characteristics may additionally or alternatively comprise a measure of the deformation or distortion of the wire over time while forming the wire bond.

In one embodiment, the bonding tool comprises an ultrasonic transducer operable to supply ultrasonic energy to form the wire bond and the operating characteristics comprise at least one of a current consumed by the ultrasonic transducer and a displacement of the bonding tool while forming the wire bond. Accordingly, the current provided to the ultrasonic transducer when forming the wire bond may be measured. Alternatively or additionally, the displacement of the ultrasonic transducer when forming the wire bond may be measured.

In one embodiment, the determining comprises determining the possible bonding failure when the operating characteristics fall outside a predefined range. Accordingly, when the measured characteristics fail to fall within a predefined range, then this may indicate a suspect bond.

In one embodiment, the determining comprises determining the possible bonding failure when the operating characteristics fall outside at least one predefined threshold. Accordingly, a suspect bond can be identified by simply comparing the operating characteristics with one or more thresholds.

In one embodiment, the determining comprises determining the possible bonding failure when the operating characteristics cross the at least one predefined threshold. Accordingly, a suspect bond can be identified by simply identifying when the operating characteristics pass through one or more thresholds.

In one embodiment, the capturing an image comprises capturing the image with a camera and the method further comprises the step of performing image processing on the image to identify whether a foreign particle is present. Hence, image processing may be performed on the captured image to identify whether or not a foreign particle is present in the vicinity of the wire bond.

In one embodiment, the image processing identifies whether a foreign particle extends from the wire bond. A foreign particle which extends or protrudes from the wire bond may indicate a bonding failure.

In one embodiment, the image processing identifies whether a foreign particle is present on a bond pad on which the wire bond is formed.

In one embodiment, the image processing identifies whether a foreign particle extends from a bond pad on which the wire bond is formed. Accordingly, the image processing may determine whether the foreign particle protrudes outside of the bond pad.

In one embodiment, the image processing identifies whether a foreign particle extends from a bond pad on which the wire bond is formed to at least an adjacent bond pad. Accordingly, the image processing may determine whether the foreign particle bridges to at least an adjacent or neighbouring bond pad.

In one embodiment, the image processing identifies whether a foreign particle is within a perimeter region of a bond pad on which the wire bond is formed. Accordingly, the image processing may determine whether the foreign particle is present near the boundary of the bond pad.

In one embodiment, the perimeter region at least partially extends around an outer edge of a bond pad on which the wire bond is formed.

In one embodiment, the perimeter region comprises a U-shaped region of a bond pad on which the wire bond is formed. Accordingly, at least a portion of the perimeter of the bond pad may be excluded from image processing.

In one embodiment, the perimeter region excludes at least a portion of an outer edge of a bond pad on which the wire bond is formed, over which the wire passes.

In one embodiment, when no foreign particle is identified, the method comprises forming further wire bonds by repeating the steps of collecting and determining. Hence, should no foreign particle be present, then the wire bonding may continue.

In one embodiment, when a foreign particle is identified, the method comprises ceasing forming further wire bonds. Hence, should a foreign particle be present, then the wire bonding may be stopped.

According to a second aspect of the invention, there is provided an apparatus for bonding wires onto surfaces, comprising: characteristic collection logic operable to collect operating characteristics of a bonding tool while forming a wire bond which bonds a wire to a surface; processing logic operable to determine whether a possible bonding failure of the wire bond has occurred as indicated by the operating characteristics; and an imaging device operable to capture an image of the wire bond to identify whether a foreign particle is present on the surface if it is determined that a possible bonding failure has occurred.

In one embodiment, the operating characteristics comprise at least one of energy consumed by the bonding tool and a deformation of the wire while forming the wire bond.

In one embodiment, the operating characteristics comprise at least one of energy consumed by the bonding tool and a deformation of the wire over a bonding period while forming the wire bond.

In one embodiment, the bonding tool comprises an ultrasonic transducer operable to supply ultrasonic energy to form the wire bond and the operating characteristics comprise at least one of a current consumed by the ultrasonic transducer and a displacement of the bonding tool while forming the wire bond.

In one embodiment, the processing logic is operable to determine the possible bonding failure when the operating characteristics fall outside a predefined range.

In one embodiment, the processing logic is operable to determine the possible bonding failure when the operating characteristics fall outside at least one predefined threshold.

In one embodiment, the processing logic is operable to determine the possible bonding failure when the operating characteristics cross the at least one predefined threshold.

In one embodiment, the imaging device comprises a camera and the processing logic is operable to perform image processing on the image to identify whether a foreign particle is present.

In one embodiment, the image processing identifies whether a foreign particle extends from the wire bond.

In one embodiment, the image processing identifies whether a foreign particle is present on a bond pad on which the wire bond is formed.

In one embodiment, the image processing identifies whether a foreign particle extends from a bond pad on which the wire bond is formed.

In one embodiment, the image processing identifies whether a foreign particle extends from a bond pad on which the wire bond is formed to at least an adjacent bond pad.

In one embodiment, the image processing identifies whether a foreign particle is within a perimeter region of a bond pad on which the wire bond is formed.

In one embodiment, the perimeter region at least partially extends around an outer edge of a bond pad on which the wire bond is formed.

In one embodiment, the perimeter region comprises a U-shaped region of a bond pad on which the wire bond is formed.

In one embodiment, the perimeter region excludes at least a portion of an outer edge of a bond pad on which the wire bond is formed, over which the wire passes.

In one embodiment, when no foreign particle is identified, the processing logic is operable to allow the bonding tool to form a further wire bond to a surface.

In one embodiment, when a foreign particle is identified, the processing logic is operable to prevent the bonding tool from forming a further wire bond to a surface.

According to a third aspect of the invention, there is provided a computer program product operable, when executed on a computer, to perform the method steps of the first aspect.

Further particular and preferred aspects are set out in the accompanying independent and dependent claims. Features of the dependent claims may be combined with features of the independent claims as appropriate, and in combinations other than those explicitly set out in the claims.

Where an apparatus feature is described as being operable to provide a function, it will be appreciated that this includes an apparatus feature which provides that function or which is adapted or configured to provide that function.

BRIEF DESCRIPTION OF THE DRAWINGS

An embodiment of the present invention will now be described further, with reference to the accompanying drawings, in which.

DESCRIPTION OF THE PREFERRED EMBODIMENT OF THE INVENTION

Before discussing the preferred embodiment in any more detail, first an overview will be provided. The preferred embodiments recognises that accurately detecting and classifying bonding failures can be problematic. In particular, one type of bonding failure which is difficult to detect efficiently is that of foreign particles such as dust which may be present when forming bonds but which can lead to a failure of the component due to the foreign particle causing a short-circuit between bond pads, which is typically only detected during functional testing after encapsulation. Such dust can be produced when transporting lead frames and may be commonly due to bar-shaped copper. The preferred embodiment described herein first detects the possibility of a bonding failure (a "suspect bond") by determining whether the characteristics measured while forming the bond fall outside of expected ranges, which would be indicative of a possible bonding failure due to the presence of a foreign particle. Only when the characteristics fall outside of the expected ranges is an image taken to determine whether that unexpected variation in the operating characteristics is due to the presence of a foreign particle or not. By imaging the bonds which fall outside the expected ranges during bond quality monitoring, those apparent failures or suspect bonds can be discounted if no foreign bodies are present. This significantly improves the identification and classification of possible bonding failures and improves the throughput of the bonding apparatus.

Wire Bonding Apparatus

Figure 1:
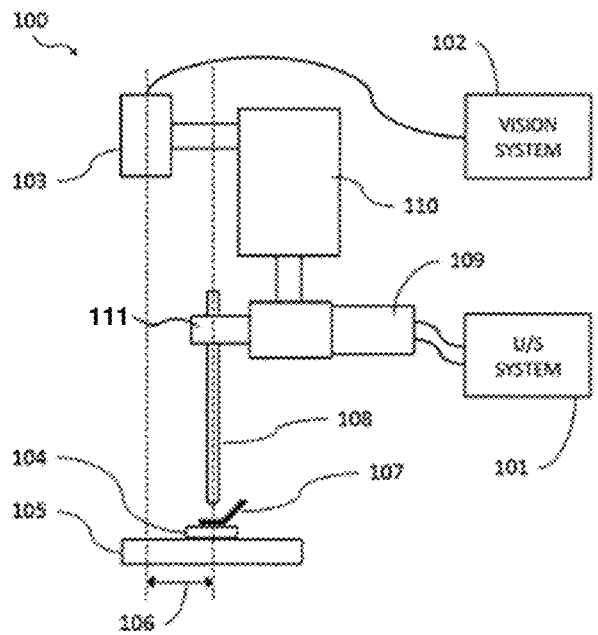
FIG. 1 illustrates a wire bonding apparatus according to the preferred embodiment of the invention.

FIG. 1 illustrates a wire bonding apparatus 100 according to the preferred embodiment of the invention. The wire bonding apparatus 100 has a bonding wedge 108 which is attached to a horn in of an ultrasonic transducer 109. Wire for forming a wire bond 107 to a surface, such as a bond pad 104 of an integrated circuit assembly 105, is fed from a wire spool (not shown) in a known manner. In this example, a wire bond is formed on the bond pad 104 of the integrated circuit assembly 105. An ultrasonic system 101 is coupled with the ultrasonic transducer 109. The ultrasonic system 101 receives information from the ultrasonic transducer 109 indicating the current consumed when forming the wire bond 107. The ultrasonic system 101 also receives information from the horn in indicating the deformation the wire bond when forming the wire bond 107. Also coupled with the ultrasonic transducer 109 is a bond head assembly 110. The bond head assembly 110 carries a camera assembly 103. The camera assembly 103 contains both a camera and typically a source of coaxial light. Coupled with the camera assembly 103 is a vision system 102 which performs image processing, as will be described in more detail below.

A spatial offset between the tip (and typically an elongate axis) of the bonding wedge 108 and the viewing axis of the camera assembly 103 is known. The bonding tip offset 106 can thus be used for alignment between the camera assembly 103 and the bonding wedge 108.

Wire Bonds

Figure 2:
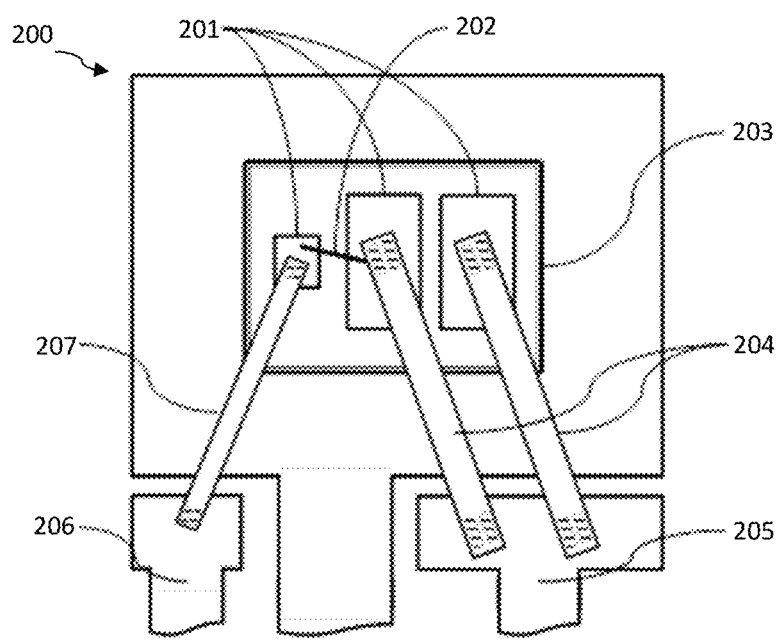
FIG. 2 is a schematic diagram illustrating an exemplary wire bond configuration of a component.

FIG. 2 is a schematic diagram illustrating an exemplary wire bond configuration of a component 200. In particular, an integrated circuit 203 has a number of bond pads 201 for receiving bonding wires 204, 207. Also shown is a gate lead post 206 and a source lead post 205 to which bonding wires 204, 207 are attached. Source bonding wires 204 connect the source lead post 205 to individual bond pads 201. The gate bonding wire 207 connects the gate lead post 206 to a bond pad 201. As can be seen in FIG. 2, a foreign particle 202 such as dust may be present as a contaminant. In the example shown in FIG. 2, the foreign particle 202 extends between adjacent bond pads 201, which will likely lead to a short-circuit between those bond pads 201.

Processing Steps

Figure 3:
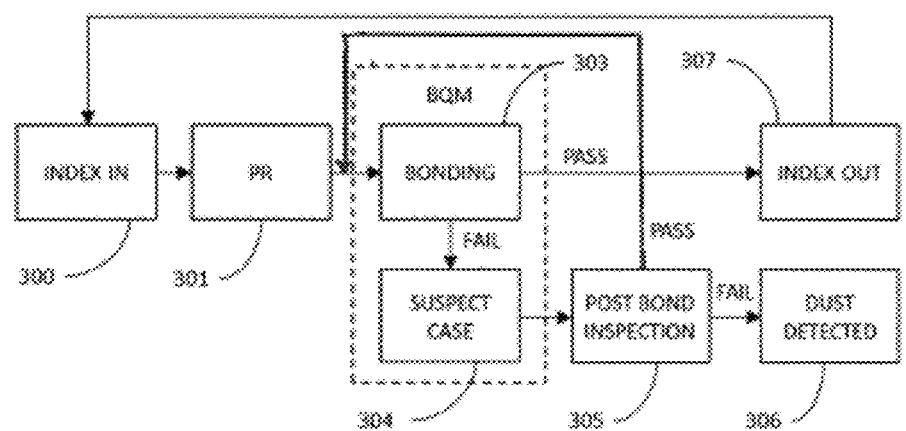
FIG. 3 illustrates the main steps performed by the wire bonding apparatus according to the preferred embodiment.

FIG. 3 illustrates the main steps performed by the wire bonding apparatus 100, according to the preferred embodiment. At step 300, a new component for bonding is received by the wire bonding apparatus 100 and processing proceeds to step 301.

Figures 4A, 4B, 4C:
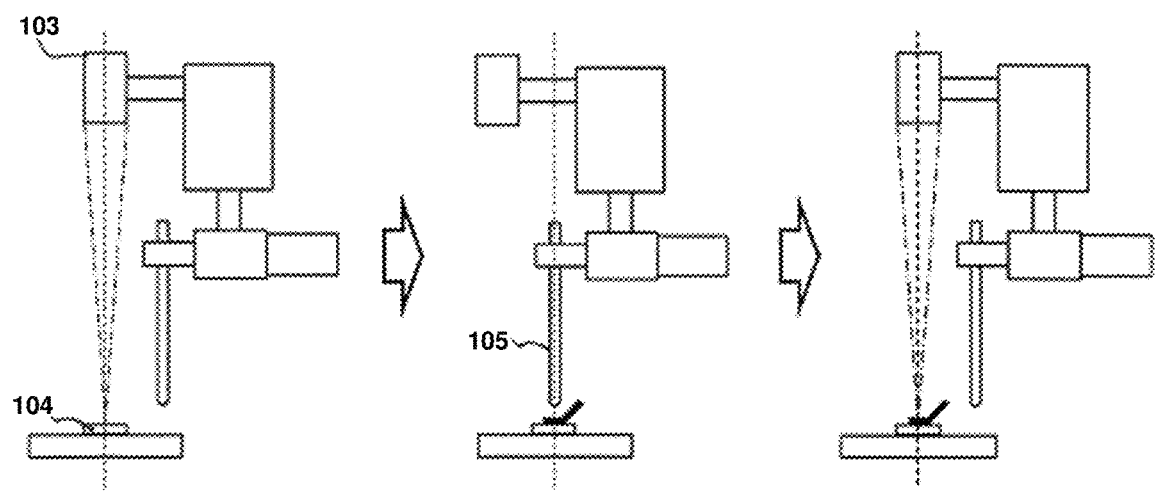
FIGS. 4A to 4C show different positions of the wire bonding apparatus.

At step 301, the camera assembly 103 is positioned relative to a bond pad 104 in order to perform an initial alignment, as illustrated in FIG. 4A. The vision system 102 performs image processing on the images captured by the camera assembly 103 to confirm when the camera assembly 103 and the component 104 are correctly aligned. Processing then proceeds to step 303.

At step 303, the bonding tip offset 106 is applied to move the bonding wedge 108 with respect to the bond pad 104, so that the bonding wedge 108 is located in the correct position to commence bonding, as illustrated in FIG. 4B. Bonding then commences. In particular, the bonding wedge 108 makes wire bonds in the manner described above and the ultrasonic system 101 records operating characteristics of the ultrasonic transducer 109 and bonding wedge 108 while forming each bond. In this example, the ultrasonic transducer 109 provides an indication of the energy consumed when making the bonds (typically by measuring the current supplied to the ultrasonic transducer 109 over the time period of making the bond) and the horn 111 provides an indication of the degree of deformation of the bonding wire over time as it is being pressed to create the bond. These measurements are recorded by the ultrasonic system 101 during the formation of each bond and analysed to determine whether these measurements fall inside or outside of expected values in order to determine whether a suspect bond had been formed.

Figure 5:
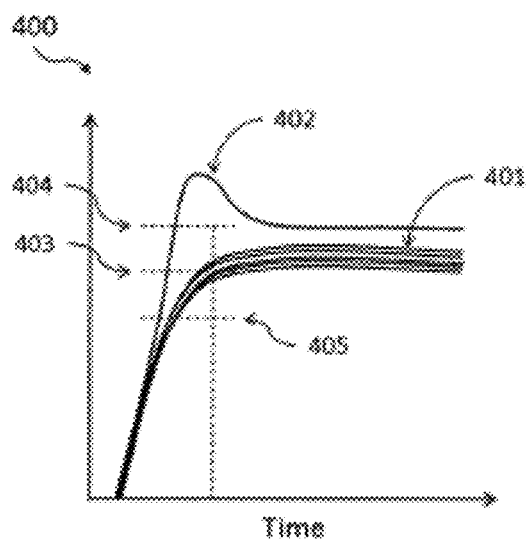
FIGS. 5 and 6 illustrate an operation of an ultrasonic system when assessing a bond according to the preferred embodiment.

FIG. 5 illustrates the operation of the ultrasonic system 101 when making such a determination, according to the preferred embodiment. In this embodiment, the ultrasonic system 101 receives an indication of the current consumed by the ultrasonic transducer 109. The ultrasonic system 101 stores an indication of the expected range of values of current consumed over time when making each bond. In this example, the ultrasonic system 101 stores an indication of an expected value 403, together with an upper current value 404 and a lower current value 405, for each point in time. The ultrasonic system 101 compares the received measurements against these values to determine the status of the bond that has been made.

Likewise, the ultrasonic system 101 receives an indication of the degree of deformation of the bonding wire over time as it is being pressed to create the bond. The ultrasonic system 101 stores an indication of the expected range of values of deformation over time when making each bond. In this example, the ultrasonic system 101 stores for each point in time an indication of an expected value 503 at that point in time, together with an upper deformation value 504 and a lower deformation value 505. The ultrasonic system 101 compares the received measurements against these values to determine the status of the bond that has been made.

As can be seen in FIG. 5, the group of measurements 401 fall within the upper current values 404 and the lower current values 405, and so are determined to be acceptable bonds. However, the measurements 402 fall outside of these thresholds and so are determined to relate to a suspect bond, meaning that a bond failure is suspected or considered likely.

Figure 6:
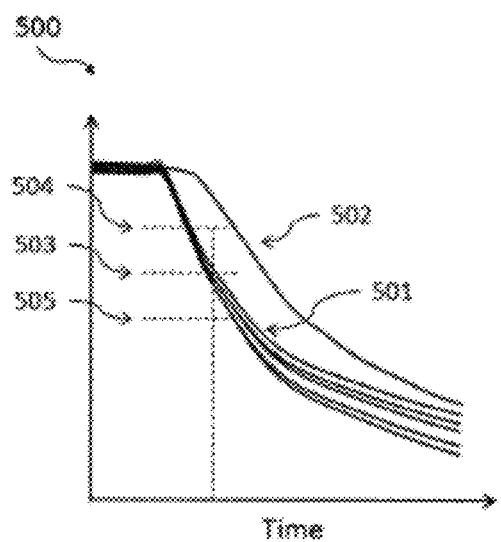

Likewise, as can be seen in FIG. 6, the group of measurements 501 fall within the upper deformation values 504 and the lower deformation values 505, and so are determined to be acceptable bonds. However, the measurements 502 fall outside of these thresholds and so are determined to relate to a suspect bond, meaning that a bond failure is suspected or considered likely.

Although in this embodiment a suspect bond is identified when either the current or the deformation measurements fall out of the expected range, it will be appreciated that other embodiments may require both of these to occur in order to identify a suspect bond. Should the measured characteristics fall within the expected range, then the bonding wedge 108 is translated with respect to the integrated circuit assembly 105 so that a bond can be made at the next wire bonding location.

However, should a suspect bond be identified at step 303, then processing proceeds to step 304 where the suspect bond is identified to be examined further and processing then proceeds to step 305 where a further inspection takes place.

At step 305, the camera assembly 103 is aligned with respect to the bond pad 104, as illustrated in FIG. 4C, in order to image the suspect bond. The image captured by the camera assembly 103 is communicated to the vision system 102 for image processing. The vision system 102 seeks to identify whether the visual appearance of the bond is unexpected. Typically, the image processing seeks to determine whether a foreign particle or contaminant is present on the bond pad 104, as will be explained in more detail below.

Should it be determined at step 305 that no foreign particle is present, then processing returns to step 303 where a further bond is then made. Once all bonds have been made, then processing proceeds to step 307 where the bonded integrated circuit assembly 105 is complete and offloaded from by the wire bonding apparatus 100.

However, should the post-bond inspection fail at step 305, which indicates that a foreign particle may be present, then processing proceeds to step 306 where the wire bonding apparatus 100 stops and reports an error to the user.

Bond Inspection

Referring to FIG. 2 in the situation where a foreign particle 202 is present, an image captured by the camera assembly 103 would reveal the presence of the foreign particle 202, which extends between the adjacent bond pads 201. Accordingly, the vision system 102 uses image processing techniques to verify the presence of the foreign particle 202 and indicate whether a foreign particle 202 is detected at step 306.

Figure 7:
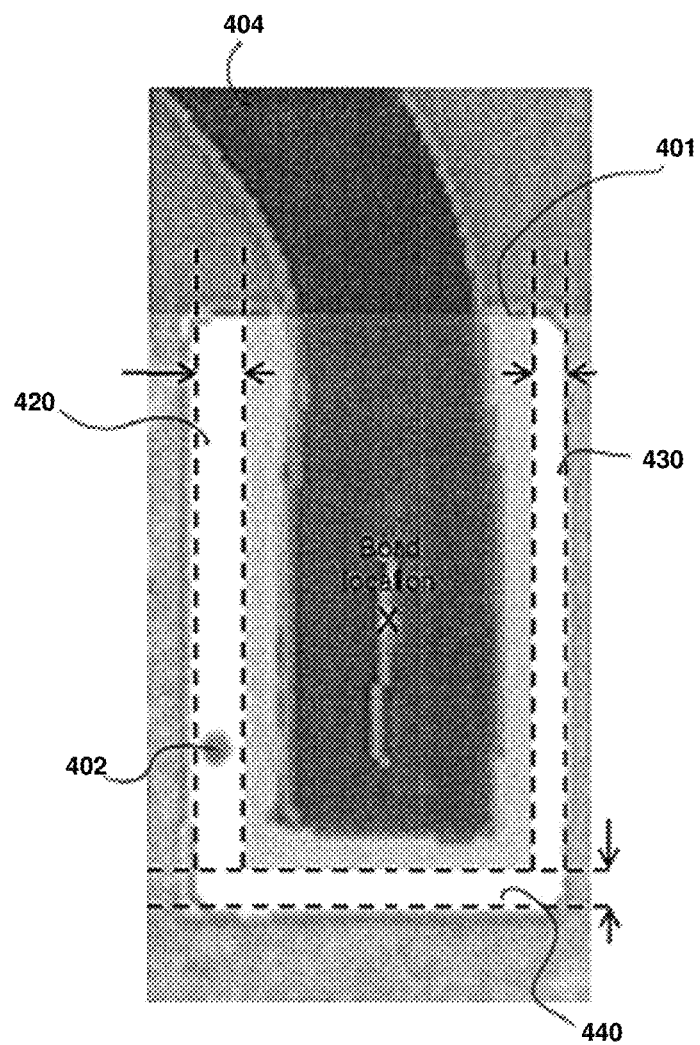
FIG. 7 shows an example of regions of an image processed according to the preferred embodiment.

FIG. 7 illustrates in more detail a technique for identifying the presence of a foreign particle, such as dust, according to the preferred embodiment. The image processing identifies the location of the bond pad 401, together with the location of the bonding wire 404. Detection zones are established within which any foreign particles may be detected. In particular, a bond ear detection zone left 420 and a bond ear detection zone right 430, together with a wire tail detection zone 440, are established. The bond ear detection zone left 420 and bond ear detection zone right 430 run generally parallel to the direction of the bonding wire 404 on the bond pad 401, along opposing elongate edges of the bond pad 401. The wire tail detection zone 440 runs perpendicular to the bonding wire 404, along a minor edge of the bond pad 401 which opposes a minor edge of the bond pad 401 over which the bonding wire 404 passes. As can be seen, the detection zones 420-440 cover a generally U-shaped area of the bond pad 401, which excludes the region over which the bonding wire 404 extends over the edge of the bond pad 401. The presence of a foreign particle 402 within this detection region will cause a post-bond inspection fail at step 305 and an indication that dust has been detected at step 306.

Accordingly, it can be seen that embodiments detect dust that appears underneath a bond, during a wire bonding process, which may cause short-circuiting between bond pads on integrated circuits (IC). The foreign particle is produced typically during a lead frame transportation process. A short-circuit on bond pads causes functional failure in electrical testing after IC encapsulation. The conductive dust across two bond pads causes a short-circuit when a test voltage is applied on the IC device. An effective detection method, especially for automobile applications to detect defects caused by copper foreign particles in their IC production line is desirable. The steps herein for checking wire bonding include Bond Quality Monitoring (BQM). BQM is a machine monitoring system using ultrasonic feedback. The system collects and monitors feedback of transducer ultrasonic current and bonding wire deformation of bonds. By analysing collected run time data the system can stop and report an error if feedback on bonds is out of tolerance. The tolerance can be set automatically or manually.

The method described according to the preferred embodiment recognises that stoppage can occur in BQM due to preset tolerances on feedback traces which are ultrasound current and wire deformation. Over reject cases may occur if the tolerances are set too tight. Also, bonds stopped by BQM may not all be due to dust under the bond, since there are some others defects for example material contamination, insufficient clamping that may also trigger the preset tolerances. So, BQM is unable to classify a kind of defect of the bond accurately. Estimated extra cycle time/unit is 150 ms to 250 ms, depending on wire configuration. This is equal to 17-25% UPH reduction for standard single row package (e.g. 1×5 mil, TO220 lead frame).

The preferred embodiment provides a more accurate and effective approach to bond quality monitoring and hence improve package yield and quality, especially on automobile devices.

The preferred embodiment provides improved accuracy and efficiency in heavy wire bonding processes.

In so far as the embodiments of the invention described above are implemented, at least in part, using software-controlled data processing apparatus, it will be appreciated that a computer program providing such software control and a storage medium by which such a computer program is stored are envisaged as aspects of the present invention.

Although illustrative embodiments of the invention have been disclosed in detail herein, with reference to the accompanying drawings, it is understood that the invention is not limited to the precise embodiment and that various changes and modifications can be effected therein by one skilled in the art without departing from the scope of the invention as defined by the appended claims and their equivalents.

The invention claimed is:

1. A method of bonding wires onto surfaces, comprising the steps of:
    collecting operating characteristics of a bonding tool while forming a wire bond which bonds a wire to a surface;
    determining whether a possible/likely/potential/suspect/suspected bonding failure of said wire bond has occurred as indicated by said operating characteristics; and
    capturing an image of said wire bond to identify whether the wire bond has been bonded onto a foreign particle that is present on said surface if it is determined that a possible bonding failure has occurred.

2. The method of claim 1, wherein said operating characteristics comprise at least one of energy consumed by said bonding tool and a deformation of said wire while forming said wire bond.

3. The method of claim 1, wherein said operating characteristics comprise at least one of energy consumed by said bonding tool and a deformation of said wire over a bonding period while forming said wire bond.

4. The method of claim 1, wherein said bonding tool comprises an ultrasonic transducer operable to supply ultrasonic energy to form said wire bond and said operating characteristics comprise at least one of a current consumed by said ultrasonic transducer and a displacement of said bonding tool while forming said wire bond.

5. The method of claim 1, wherein said determining comprises determining said possible bonding failure when said operating characteristics fall outside a predefined range.

6. The method of claim 1, wherein said determining comprises determining said possible bonding failure when said operating characteristics fall outside at least one predefined threshold.

7. The method of claim 1, wherein said determining comprises determining said possible bonding failure when said operating characteristics cross at least one predefined threshold.

8. The method of claim 1, wherein said capturing an image comprises capturing said image with a camera and the method further comprises the step of performing image processing on said image to identify whether a foreign particle is present.

9. The method of claim 8, wherein said image processing identifies whether a foreign particle extends from said wire bond.

10. The method of claim 8, wherein said image processing identifies whether a foreign body is present on a bond pad on which said wire bond is formed.

11. The method of claim 8, wherein said image processing identifies whether a foreign body extends from a bond pad on which said wire bond is formed.

12. The method of claim 8, wherein said image processing identifies whether a foreign body extends from a bond pad on which said wire bond is formed to at least an adjacent bond pad.

13. The method of claim 8, wherein said image processing identifies whether a foreign body is within a perimeter region of a bond pad on which said wire bond is formed.

14. The method of claim 13, wherein said perimeter region at least partially extends around an outer edge of a bond pad on which said wire bond is formed.

15. The method of claim 13, wherein said perimeter region comprises a U-shaped region of a bond pad on which said wire bond is formed.

16. The method of claim 13, wherein said perimeter region excludes at least a portion of an outer edge of a bond pad on which said wire bond is formed, over which said wire passes.

17. The method of claim 1, wherein, when no foreign body is identified, said method comprises forming further wire bonds by repeating said steps of collecting and determining.

18. The method of claim 1, wherein, when a foreign body is identified, said method comprises ceasing forming further wire bonds.

19. A non-transitory computer program product operable, when executed on a computer, to perform the method steps of claim 1.

20. An apparatus for bonding wires onto surfaces, comprising: characteristic collection logic operable to collect operating characteristics of a bonding tool while forming a wire bond which bonds a wire to a surface;
    processing logic operable to determine whether a possible bonding failure of said wire bond has occurred as indicated by said operating characteristics; and
    an imaging device operable to capture an image of said wire bond to identify whether the wire bond has been bonded onto a foreign body that is present on said surface if it is determined that a possible bonding failure has occurred.

* * * * *